United States Patent [19]
Brown et al.

[11] Patent Number: 5,637,418
[45] Date of Patent: Jun. 10, 1997

[54] PACKAGE FOR A FLAT ELECTROCHEMICAL DEVICE

[75] Inventors: Stephanie D. Brown, Atlanta; Edmond Louie; Shekhar L. Pendalwar, both of Lawrenceville, all of Ga.

[73] Assignee: Motorola, Inc., Schaumburg, Ill.

[21] Appl. No.: 598,779

[22] Filed: Feb. 8, 1996

[51] Int. Cl.$^6$ .................................................. H01M 6/00
[52] U.S. Cl. .......................... 429/127; 429/162; 429/163; 429/181
[58] Field of Search ...................................... 429/127, 162, 429/163, 178, 181, 185

[56] References Cited

U.S. PATENT DOCUMENTS

| | | | |
|---|---|---|---|
| 4,152,825 | 5/1979 | Braneau | 29/623.2 |
| 4,172,319 | 10/1979 | Bloom et al. | 29/623.4 |
| 4,623,598 | 11/1986 | Waki et al. | 429/162 |
| 5,057,385 | 10/1991 | Hope et al. | 429/162 |
| 5,187,564 | 2/1993 | McCain | 174/260 |
| 5,326,652 | 7/1994 | Lake | 429/127 |
| 5,456,000 | 10/1995 | Gozdz et al. | 29/623.2 |
| 5,460,904 | 10/1995 | Gozdz et al. | 429/192 |
| 5,478,668 | 12/1995 | Gozdz et al. | 429/127 |

*Primary Examiner*—Stephen Kalafut
*Assistant Examiner*—Jonathan S. Krueger
*Attorney, Agent, or Firm*—Kenneth M. Massaroni

[57] ABSTRACT

A package for a flat electrochemical device comprises a flexible circuit board. Building from a base layer (62), the flexible circuit board has a conductor layer disposed on the outermost side of the base layer providing a first and second contact portion (56 and 58), a cover coat layer (50) is disposed over the conductor layer and the base layer over the outermost side of the base layer, a first collector (64) is disposed on the first half (47) on the innermost side of the base layer, and a second collector (66) is disposed on the second half (48) on the innermost side of the base layer. The first collector is electrically connected to a runner by a first plated through-hole (70), and the second collector is electrically connected to the second contact portion through a second plated through-hole (72). And finally, a fringe portion (68) is provided by the base layer about the periphery of the first and second halves. Upon assembly, an electrochemical cell stack is place on one half of the circuit board, the other half is folded over the cell stack, and the fringe portion of the first half is sealed to the fringe portion of the second half.

11 Claims, 7 Drawing Sheets

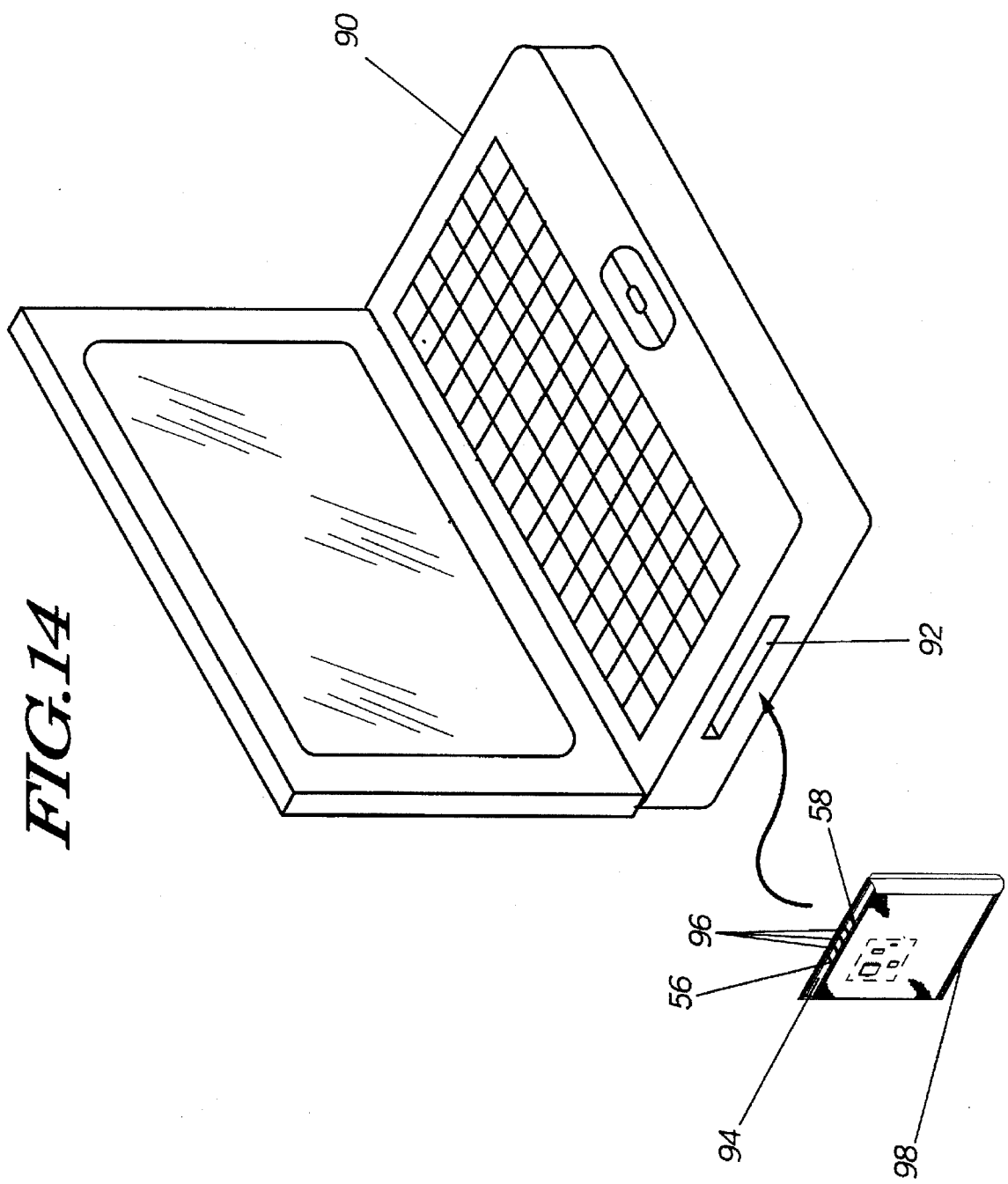

PACKAGE FOR A FLAT ELECTROCHEMICAL DEVICE

TECHNICAL FIELD

This invention relates in general to electrochemical devices, and more particularly, to packages for flat electrochemical devices.

BACKGROUND

Solid state electrochemical devices offer advantages over conventional sealed wet cell devices, such as, for example, nickel cadmium, nickel metal-hydride, alkaline, and lead-acid batteries. These conventional devices, and numerous others, are produced in sealed packages such as metal cans, or rigid plastic containers. This is primarily because of their dependence on fluid electrolyte, and the need to contain the electrolyte. Containers of this type add considerable weight to the device assembly, and limit the form the device may take.

Electrochemical devices, including batteries and electrochemical capacitors, however, do not necessarily require liquid electrolyte, and therefore do not necessarily require rigid packaging to act as an exoskeleton. A common requirement for an electrochemical device package, however, is that it be hermetically sealed to prevent gases from entering the package. Furthermore, it is desirable to have a flexible package for solid state electrochemical devices if the solid state cells themselves are flexible, thus providing a flexible energy source. This reduces the design constraints for host devices, such as, for example, cellular phones, which could use solid state energy sources.

Accordingly, a variety of flexible packaging structures have been developed for electrochemical devices. One example can be found in U.S. Pat. No. 5,057,385 to Hope et al. Briefly, the preferred package material discussed therein is a laminar structure comprising a metal foil layer sandwiched between polymeric layers, formed into an envelope which is heat sealed. The metal foil layer is used only as barrier to moisture and gasses. This laminate provides not only a flexible package, but also one which is much lighter than conventional rigid packages. This is considered a significant market advantage in weight sensitive portable products, such as cellular phone markets.

One of the chief considerations in designing a package for a flat electrochemical device is how to provide electrical connections from the cell or cell stack inside the package to electrical contacts outside the package while maintaining the hermetic integrity of the package. In the design discussed in the above referenced patent, a conductor tab is extended from the cell inside the package between the two envelope sides to the outside, bonding the laminate to the tab. In practice this is a very difficult seal to maintain. Plastic to metal bonds of this type tend to be weak and short lived, particularly if the package is flexed often, or subject to mechanical shock. Since the problem with this design is partly due to the length of the bonds, a subsequent design sought to improve on this by using conductor mesh, or screen material instead of tab stock. This allowed the polymeric layers to bond to each other between the wires of the mesh, thus significantly reducing the path length of the plastic to metal bonds. However, although this proved to be an improvement, it still was not robust enough for use with many portable electrical devices.

A more recent approach to this problem can be found in U.S. Pat. Nos. 5,456,000 and 5,460,904. These patents are commonly assigned, and describe similar subject matter.

The problem of the plastic to metal seal was eliminated by the use of rivets and O-ring seals. This is a similar approach used in conventional canned cells, and has proven to be very robust in those devices. A tab is extended from the current collector, and the rivet passes through the tab and the package. The package is an envelope comprising sides formed by a pair of polymeric layers separated by a metal foil layer, similar to that used to package foodstuffs, and similar to the laminate used by Hope, above. The rivet compresses a coaxial O-ring located inside the package with enough force to maintain an airtight seal. This approach works well, but adds significant cost to the package, both in material and assembly. In addition, the rivet provides opportunity for failure. For Example, the O-ring may be flawed, or become torn during assembly, or may not be placed at all. Therefore it would be desirable to find a less complicated and less expensive method of providing external connections.

A rivet-less approach has been designed and implemented by Gould Electronics Inc. on their Powerdex® line of planar primary lithium batteries. The packaging is essentially an adhesively backed polymeric label with a pair of openings formed therethrough. The packaging laminate has no metal foil layer. The cell structure comprises two copper current collectors, one for each electrode. One collector is directly exposed through one of the openings in the label, and the other is extended from the cell, and folded over to the same side of the cell as the first collector. The two collectors are separated by a layer of card stock paper board, through which a hole is formed corresponding with one of the openings to expose the first collector. The second collector has a portion corresponding with the second opening in the label, and is exposed through the second opening. This approach works well for primary cells, but lacks the robust hermeticity required for rechargeable electrochemical devices used with portable electronic devices. Further, the label assembly method, while a significant improvement over the rivet method, still leaves much to be desired for high volume manufacturing.

A simpler method than the Gould method is disclosed in U.S. Pat. No. 4,623,598. The package disclosed therein provides both contacts on the same side of the package, and it is easily sealable to provide the level of hermeticity necessary for portable products. The package is formed from a sheet which has two halves. A collector is disposed on each half. However, in order to provide both contacts on the same side of the package, the first collector extends from its half onto the other half. This necessarily reduces the area available for the second collector. Further, in order to insulate the portion first collector which extends onto the second half from the active material of the second collector contacts, an insulating layer is required between the active material and the extended portion. This can further reduce the area of active material which the second collector may come in contact with. In order to provide a contact large enough to be useful, a significant portion of the active material will not be accessible to the second collector, and therefore will not be utilized. This has the effect of reducing the capacity of the electrochemical cell.

Therefore, there exists a need for a flat electrochemical device package which provides a robust hermetic seal, is easily assembled, allows full utilization of the active materials, and provides a cost advantage over known packaging methods.

BRIEF DESCRIPTION OF THE DRAWINGS

FIG. 14 is a perspective view of host device utilizing a flat electrochemical device packaged in accordance with a fourth embodiment of the invention.

DETAILED DESCRIPTION OF THE PREFERRED EMBODIMENT

Figure 1:
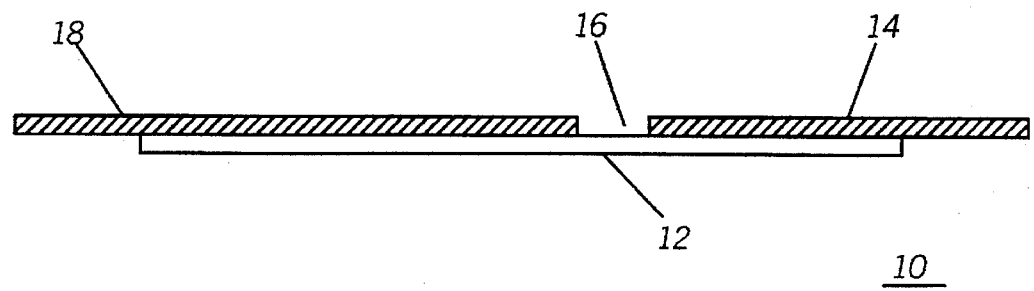
FIG. 1 is a cut-away side view of a packaging laminate in accordance with a first embodiment of the invention.

While the specification concludes with claims defining the features of the invention that are regarded as novel, it is believed that the invention will be better understood from a consideration of the following description in conjunction with the drawing figures, in which like reference numerals are carried forward.

Referring now to FIG. 1, a cut-away side view of a packaging laminate 10 in accordance with the invention. The laminate comprises a conductor layer 12 and a polymeric layer 14. The conductor layer may be a conductive polymer, but is preferably metallic, and is either a foil or a layer of metal which has been deposited by some other means such as electro-deposition. The latter method is used for making flexible circuit boards, and is particularly well suited for making packaging laminates. A sheet of laminate has a polymeric layer such as polyimide, and a conductor layer such as copper. In flexible circuit board manufacturing, circuit wiring is made by chemically treating selected portions of copper to etch them away, leaving only the regions necessary to form circuit interconnections on the polymeric layer. In the present invention, the conductor layer may be fabricated of materials selected from the group consisting of copper, aluminum, nickel, tin, gold, silver, conductive polymers and combinations thereof. The conductor layer, as is described hereinbelow, will act to provide a barrier, and will be utilized as a current collector. To provide an electrochemical device contact, an opening 16 is provided through the polymeric layer to expose a portion of the conductor layer.

The polymeric layer acts as a barrier, and must have good resistance against solvents, moisture, and air. It can be fabricated of a wide range of materials, such as those selected from the group consisting of polyimide, polyethylene, polyester, fluoroplastics, and combinations thereof. In practice the polymeric layer will usually itself consist of two or more layers of different material, each layer chosen for a specific property such as moisture barrier, resistance to solvents, etc. The polymeric layer, if the packaging laminate is to be flexible, preferably has a thickness in the range of 25–125 microns.

Figure 2:
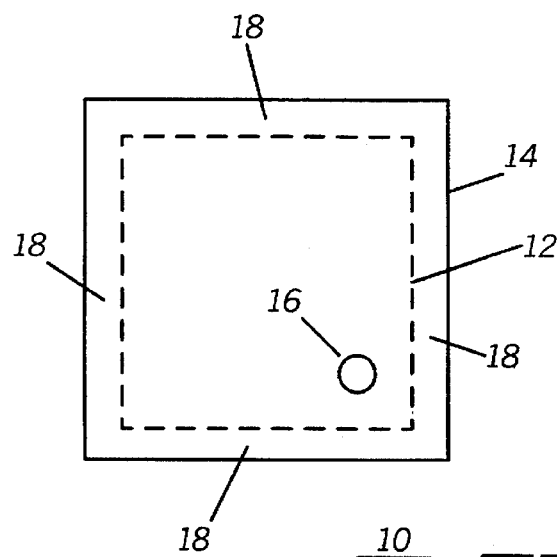
FIG. 2 is a top plan view of a packaging laminate in accordance with a first embodiment of the invention.
Figure 3:
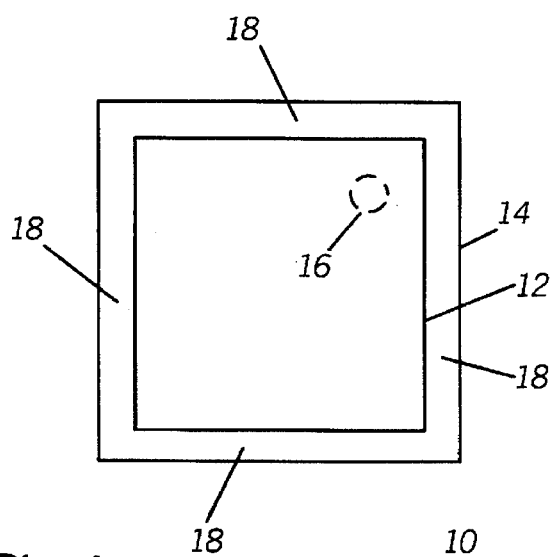
FIG. 3 is a bottom plan view of a packaging laminate in accordance with a first embodiment of the invention.

FIGS. 2 and 3, a top and bottom plan view, respectively, of a packaging laminate 10 in accordance with a first embodiment of the invention, illustrate one possible shape for the laminate. The conductor layer 16 is shaped in correspondence with the electrochemical device perimeter, and in general, is square, rectangular, or circular, according to the shape of the electrochemical device cell stack. The polymeric layer has a fringe portion 18 which is disposed about the edges of the polymeric layer, and extends beyond the conductor layer in all directions.

Figure 4:
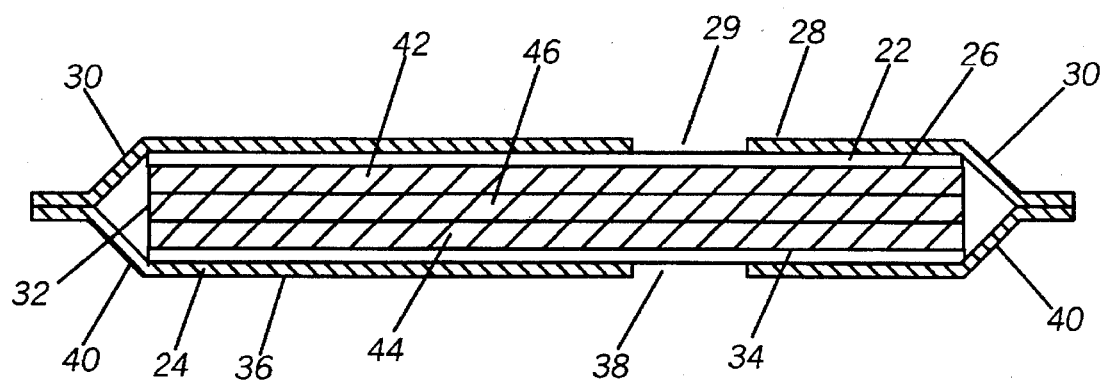
FIG. 4 is a cut-away side view of a flat electrochemical device packaged with a laminate in accordance with a first embodiment of the invention.

Referring now to FIG. 4, a cut-away side view of a flat electrochemical device 20 packaged with laminates in accordance with a first embodiment of the invention, there is illustrated therein a package for a flat electrochemical device comprising a first packaging laminate 22 and a second packaging laminate 24. The thickness of the device has been exaggerated to more clearly illustrate the various layers. The electrochemical device could be, for example, a battery, an electrochemical capacitor, or an electrochemical sensor. The first and second packaging laminates are essentially the same as that illustrated in FIGS. 1–3. The first packaging laminate has a conductor layer 26, and a polymeric layer 28. The polymeric layer has an opening 29 for exposing a portion of the conductor layer 26, thus providing a first electrochemical device contact. Further, the polymeric layer has a fringe portion 30, which extends beyond the conductor layer. The second packaging laminate essentially duplicates the first packaging laminate, but on the other side of the cell stack 32, and comprises a conductor layer 34, a polymeric layer 36, an opening, 38, and a fringe portion 40. The electrochemical cell stack comprises a first electrode 42 made of a first active material, a second electrode 44 made of a second active material, and an electrolyte 46. The electrolyte 46 is disposed between the first and second electrodes, and may be a solid state electrolyte. The cell stack may comprise a series of electrochemical cells, each having first and second electrodes separated by an electrolyte layer, as is common in the art. The electrodes are sized and shaped in correspondence with each other, and jointly define the cell perimeter as the perimeter around the edges of the cell stack.

To assemble and package the flat electrochemical device, the conductor layer of the first packaging laminate is joined to the first electrode, as is the conductor layer of the second packaging laminate to the second electrode. The conductor layers can be joined by any of several techniques such as welding, or by conductive adhesive, for example. It is important that the conductor layers do not extend beyond the electrochemical device perimeter, or else the electrochemical cell may be shorted if the conductor layers come in contact with the other parts of the cell. By joining the conductor layers to the corresponding electrodes, the laminates function both as a barrier, and as a current collector. This is distinguished from the envelope package used in the prior art since the prior art teaches a conductor layer sandwiched between two polymeric layers. Here the conductor layer of the packaging laminate is dually utilized as a current collector and electrical contact. The electric potential and current provided by the electrochemical device is available through openings 29 and 38 in the polymeric layers. To seal the package, the fringe portions 30 and 40 of the polymeric layers are sealed to each other around the entire device perimeter. This seal is preferably hermetic, and can be accomplished by any number of well known methods such as heat sealing, for example. After the fringe portions are joined together, any excess polymeric material may be removed. A slight variation on the first embodiment is to form the conductor layer and the polymeric layer the same size and shape, and provide another polymeric layer on the conductor layer opposite from the first polymeric layer corresponding to the fringe portion, about the edges of the laminate. This variation of the fringe portion will be described in further detail hereinbelow.

This method of packaging can easily provide a hermetic seal, and provides flexibility if necessary. In order for the electrochemical device to be flexible, the various members of the cell stack must be flexible. This first embodiment provides an easily assembled and sealed flat electrochemical device with one contact disposed on each side of the package. In some situations it may be more preferable to have both contacts on the same side of the package. The use of flexible circuit board manufacturing techniques provides a simple solution that allows all of the active materials of the electrochemical device to be utilized.

Figure 5:
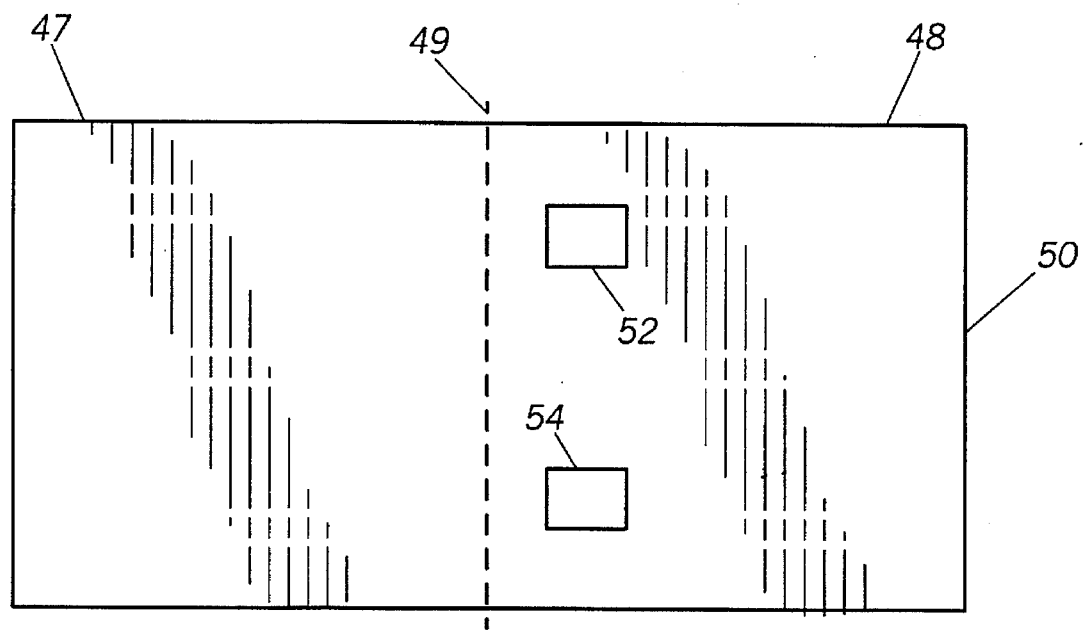
FIG. 5 is a bottom plan view of a cover coat layer for a flexible circuit board in accordance with a second embodiment of the invention.

Referring now to FIGS. 5–8, where there is illustrated therein the various layers of a flexible circuit board in accordance with a second embodiment of the invention. In general, the circuit board is divided into a first half 47 and a second half 48, one half on each side of a centerline 49. FIG. 5 shows a cover coat layer 50 which has a first opening 52, and a second opening 54 through it's second half 48. The cover coat layer is polymeric, and may be fabricated of the same materials mentioned in reference to the packaging laminate of FIGS. 2 and 3. Upon assembly, the cover coat layer will be the outermost layer of the package, and the contacts for electrically connecting to the electrochemical cell will be exposed through the first and second openings.

Figure 6:
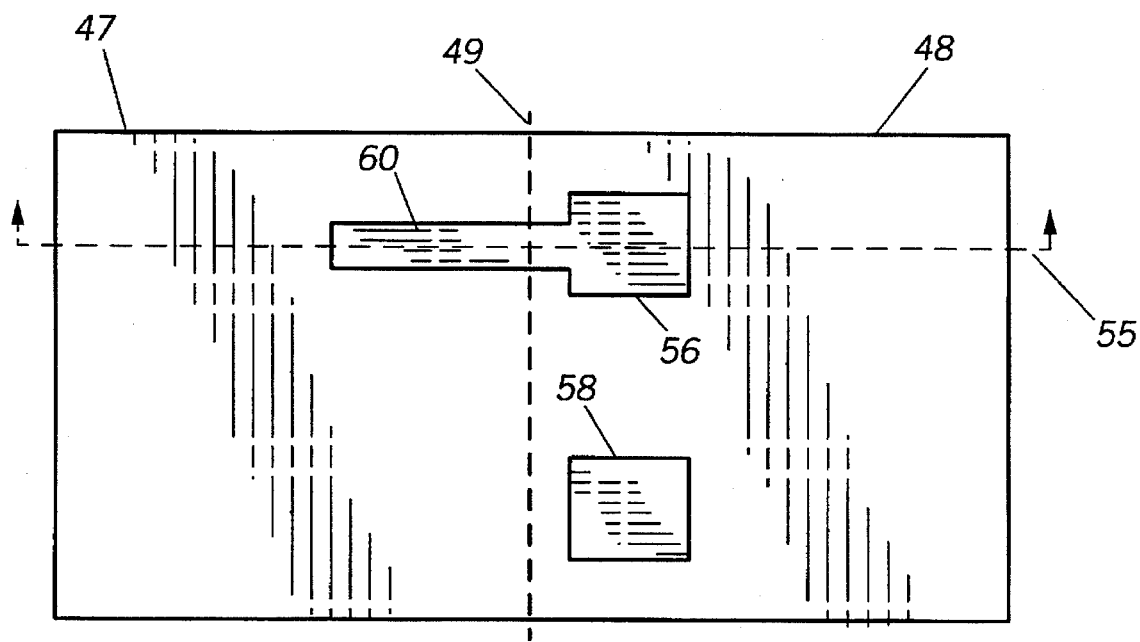
FIG. 6 is a bottom plan view of a cover coat layer for a flexible circuit board including a conductor layer in accordance with a second embodiment of the invention.

FIG. 6 shows the next layer of the circuit board, which is a first conductor layer. The conductor portions on this layer provide the contacts, and are preferably fabricated of the same materials as the conductors described in reference to FIGS. 1–5. There is a first contact portion 56, and a second contact portion 58. The side shown here is the innermost side upon assembly, and the opposite side of the first contact portion 56 will be exposed through the first opening 52, and the outermost side of the second contact portion 58 will be exposed through the second opening 54. The first contact portion has an integrally formed runner 60 which extends across the centerline 49 to the first half 47 of the flexible circuit board.

Figure 7:
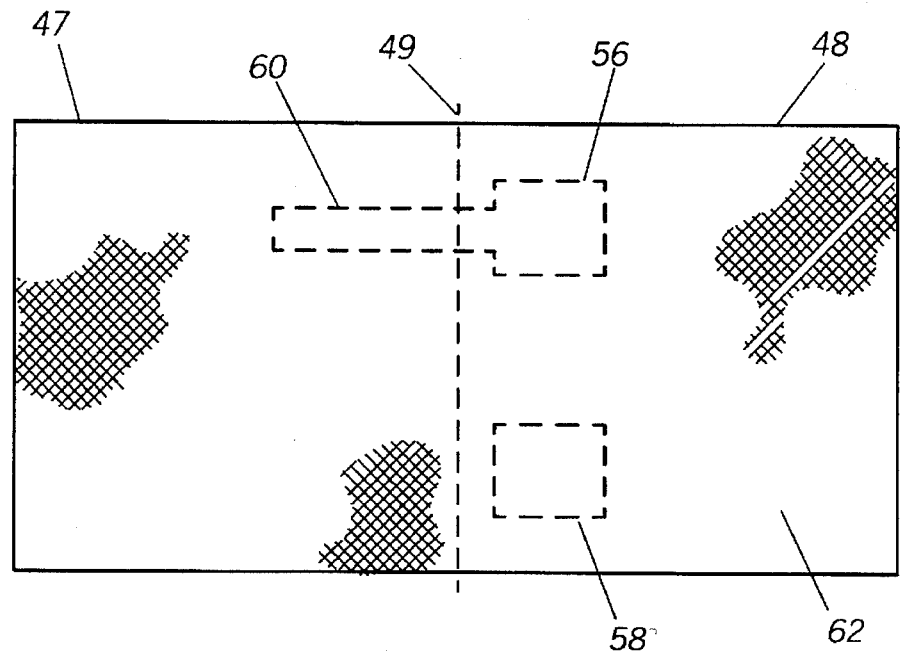
FIG. 7 is a bottom plan view of a base layer for a flexible circuit board in accordance with a second embodiment of the invention.

FIG. 7 shows a base layer 62. In practice, this is the foundation layer upon which all others are consecutively laminated. It is a polymeric layer like the cover coat layer. The first and second contact portions are shown in phantom to illustrate their relative positions.

Figure 8:
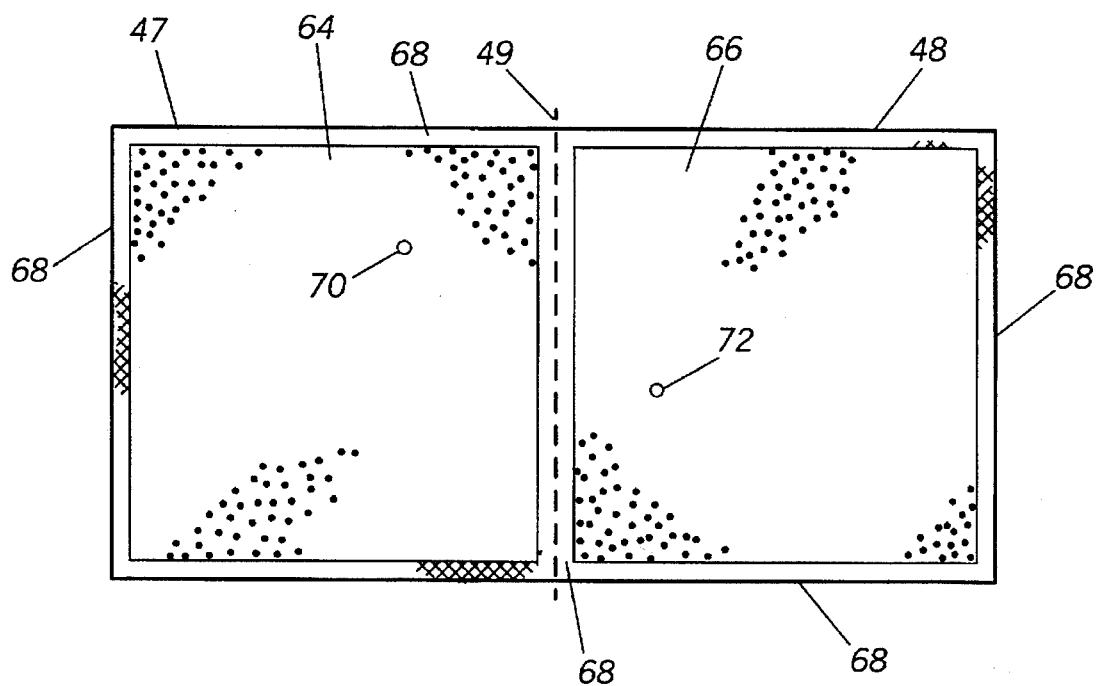
FIG. 8 is a bottom plan view of a flexible circuit board in accordance with a second embodiment of the invention.

FIG. 8 shows the addition of a second conductor layer. This conductor layer is also preferably fabricated of the same materials as the first conductor layer, and comprises a first collector 64 disposed on the first half 47 of the circuit board, and a second collector 66 disposed on the second half 48 of the circuit board. The collectors are sized so that a substantial majority of the base layer is covered, leaving only a fringe portion 68 of the base layer 62 not covered. The fringe portion extends around the entire periphery of the first and second halves. Upon assembly, this second conductor layer will be the innermost layer of the package. The first and second collectors will be in intimate contact with the first and second electrodes of the electrochemical cell stack placed therein. In practice, the size of the electrochemical cell stack dictates the size of the collectors, as they are preferably the same size, or slightly larger than the electrodes. This allows the package to effectively utilize all of the active materials of the electrodes, resulting in more usable energy storage capacity and energy delivery capacity.

In order for electrical energy to be transferred into or out of the electrochemical cell, the first and second collectors must be connected to the first and second contact portions, respectively. In accordance with flexible circuit board techniques, a first plated through-hole 70 is provided through the first collector, base layer, and runner 60. This through-hole is plated, thereby electrically connecting the first collector with the first contact portion. Likewise, a second plated through-hole 72 connects the second collector with the second contact portion. It is important that the through-holes do not perforate the cover coat layer, so that the package remains hermetic.

To briefly summarize the structure of the flexible circuit board, and building from the base layer, a flexible circuit board has a conductor layer disposed on the outermost side of the base layer providing a first and second contact portion, a cover coat layer is disposed over the conductor layer and the base layer over the outermost side of the base layer, a first collector is disposed on the first half on the innermost side of the base layer, and a second collector is disposed on the second half on the innermost side of the base layer. The first collector is electrically connected to a runner by a first plated through-hole, and the second collector is electrically connected the second contact portion through a second plated through-hole. And finally, a fringe portion is provided by the base layer about the periphery of the first and second halves.

Figure 9:
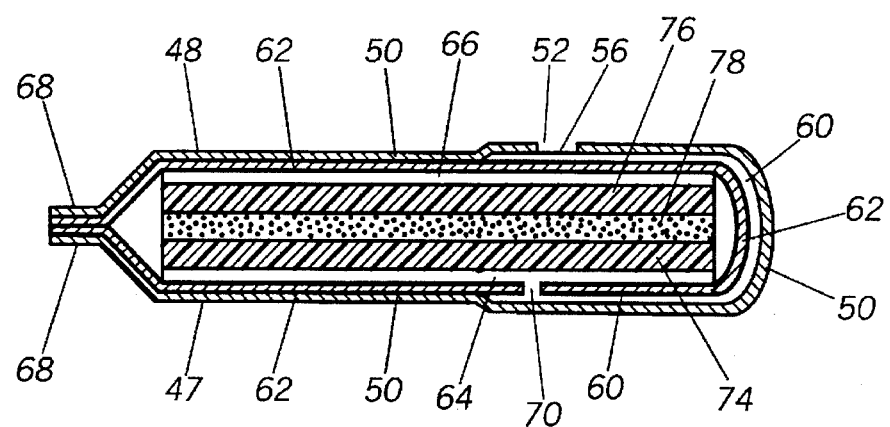
FIG. 9 is a cut-away side view of a flat electrochemical device packaged with a flexible circuit board in accordance with a second embodiment of the invention.

Referring now to FIG. 9. where there is illustrated therein a cut-away side view of an assembled electrochemical device using a package in accordance with a second embodiment of the invention. The package is formed with the flexible circuit board of FIGS. 5–8. This particular view is taken along line 55 of FIG. 6. The package is assembled by placing the electrochemical cell stack on one half of the flexible circuit board over it's corresponding collector, then folding the other half over the electrochemical cell stack and sealing the fringe portion 68 of the first half to the fringe portion 68 of the second half around the entire periphery of the device except along the centerline 49, which in this view is perpendicular to the page. The first half of the flexible circuit board is then adjacent the first electrode, and the second half of the circuit board is adjacent the second electrode. Since the fringe portions are polymeric, heat sealing is the preferred method of sealing them together.

The cover coat layer 50 is the outermost layer, and extends around the entire package. The first opening 52 exposes a portion of the first contact portion 56. The runner 60 now extends around one edge of the package from the second half 48 to the first half 47. The base layer 62, like the cover coat layer, extends around the entire package. In practice the cover coat layer is typically the same size as the base layer, but may be smaller. At the innermost side of the package is first collector 64 and second collector 66. The first collector is in intimate contact with the first electrode 74, the second collector is in intimate contact with the second electrode 76, and an electrolyte 78 is disposed between the first and second electrodes. By intimate contact it is meant that the collectors make electrical contact with all or nearly all of the surface of the electrodes. To ensure that this is achieved, it is preferably that the collectors be slightly oversized so that placement variations still allow all of the electrode surfaces to contact the collectors. Various techniques exist for joining the electrodes to their respective collectors, such as, for example, ultra-sonic welding, or conductive adhesives.

Figure 10:
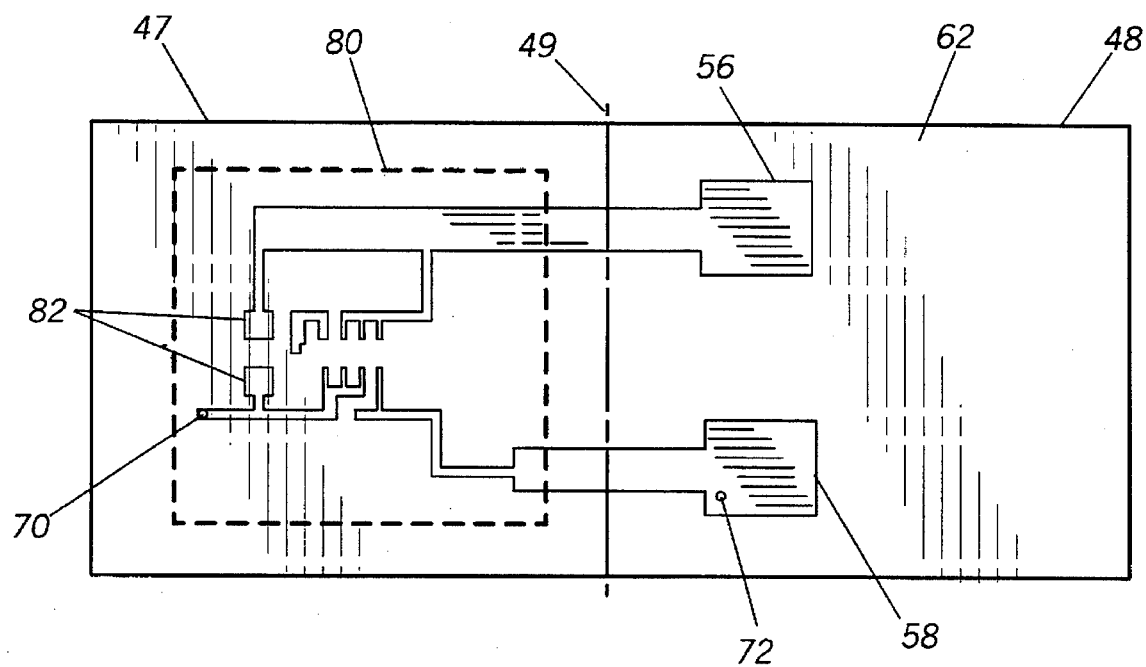
FIG. 10 is a top plan view of a base layer having a conductor layer in accordance with a third embodiment of the invention.

Since a great number of electrochemical devices manufactured for portable devices employ electronic circuitry, it would be desirable to incorporate a circuit substrate onto the device package. It is possible to take advantage of the flexible circuit board package to achieve this end. Referring now to FIG. 10, there is illustrated therein a top plan view of a base layer 62 having circuit interconnections 80 formed thereon in accordance with a third embodiment of the invention. This view shows the base layer from the opposite side shown in FIG. 7. In practice this is more representative of the order in which flexible circuit boards are assembled. The second conductor layer of FIG. 6 is etched on the base layer to leave first contact portion 56, second contact portion 58, and circuit interconnections 80. The circuit interconnections are electrically connected to the collectors, as before, by plated through-holes 70 and 72, and at least one of the circuit interconnections depends from the runner 60. Formed in the circuit interconnections are conductor pads, such as pads 82. Once the contact portions and pads are formed on the base layer, the cover coat layer is placed over the flexible circuit board. The cover coat, as is well known in the art, has openings for exposing the contact portions and the pads. Electrical components are placed on the pads to form an electrical, or electronic circuit. Circuits typically employed with batteries include, for example, state of charge indicators, memory elements, charge control circuits, and disconnect switches and associated control circuits.

Figure 11:
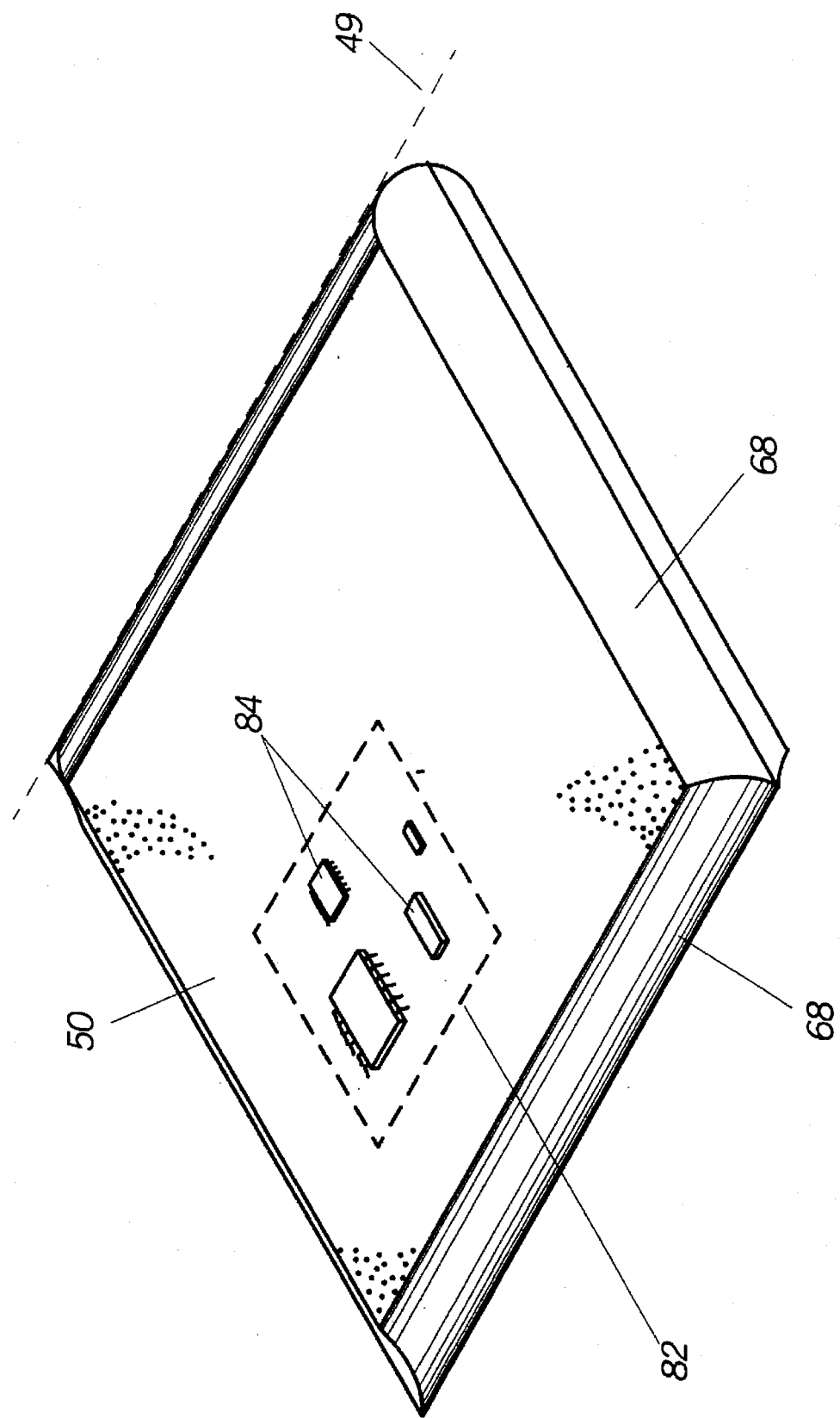
FIG. 11 is a perspective view of a flat electrochemical device packaged in accordance with a third embodiment of the invention.

A perspective view of a flat electrochemical device employing the embodiment of FIG. 10 is presented in FIG. 11. From this view it can be seen that the flexible circuit board package has been folded in half along centerline 49. The only portion of the package which can be seen in this illustration is the cover coat layer 50. The fringe portions 68 have been sealed around the entire periphery of the device, except along the centerline. Electrical components 82 are attached to circuit interconnections through openings in the cover coat layer, such as pad openings 84, to form a circuit. In practice a cover or sheath would typically be placed over the package to protect the circuit components.

Figure 12:
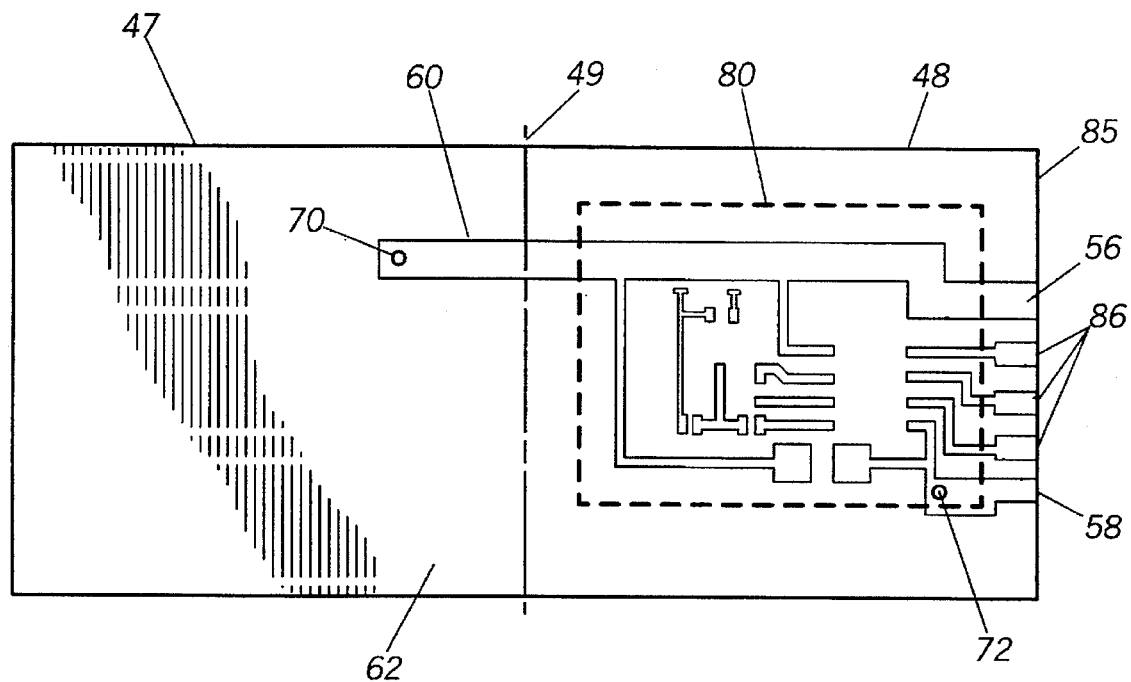
FIG. 12 is a top plan view of a base layer having a conductor layer in accordance with a fourth embodiment of the invention.

Referring now to FIG. 12, where there is illustrated therein a top plan view of a base layer 62 having a conductor layer including circuit interconnections 80 disposed thereon in accordance with a forth embodiment of the invention. Here the contact portions 56 and 58 are disposed on an edge 85 of the base layer. Further, this illustration shows the addition of auxiliary contact portions 86, which may be used by a host device for connecting to circuit components.

Figure 13:
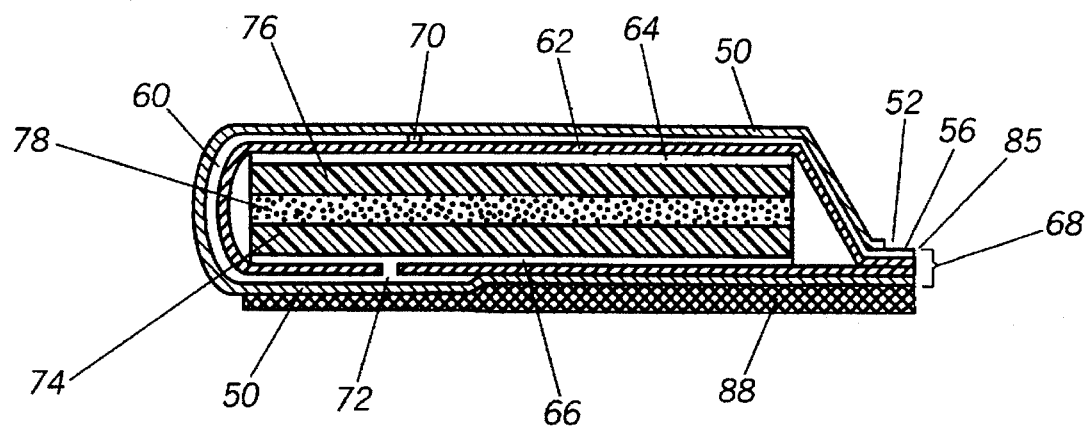
FIG. 13 is a cut-away side view of a flat electrochemical device packaged in accordance with a fourth embodiment of the invention.

Referring now to FIG. 13, where there is illustrated therein a cut-away side view of an electrochemical device packaged with a flexible circuit board in accordance with a fourth embodiment of the invention. As in FIG. 9, the thickness has been exaggerated for clarity. The assembly is similar to that shown in FIGS. 9 and 11, with two important distinctions. First, the contact portions, such as first contact portion 56, is located at the edge 85, located over fringe portions 68 which are heat sealed together. Second, a stiffener 88, which is rigid, is disposed on the package to support the edge 85. This provides the edge 85 with a card edge connector, and the contact portions may be inserted into mating card edge connectors or other types of sockets.

An application of this embodiment is illustrated in FIG. 14. Briefly, there is shown therein a host device, such as a portable computer 90 having a card socket 92. An electrochemical device 94 packaged in accordance with a forth embodiment of the invention has a card edge connector 96 for allowing the host device to access electrical circuitry 98 disposed on the electrochemical device, and to transfer energy into and out of the electrochemical cell stack packaged therein. The flat electrochemical device could be, for example, an electrochemical capacitor, used to enhance the pulse current discharge performance of a battery pack, such as may be required when using a wireless modem.

By using packaging laminates and flexible circuit boards in accordance with the various embodiments of the invention as described above, it is possible to provide a package for a flat electrochemical device that is both easy to assemble, and provides a hermetic seal which can withstand the conditions necessary for portable products. In addition, the package thus provided may be flexible, and can incorporate other electrochemical device pack elements such as circuit interconnections. Further, the package allows the maximum utilization of the active material of the cell stack in the smallest possible package. The package provided is both easily fabricated by conventional techniques, is cost efficient, and is inherently more robust than packages produced by other known techniques.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A package for a flat electrochemical device, said flat electrochemical device comprising a cell stack having first and second electrodes, said package comprising:

a flexible circuit board having a first half and a second half, said flexible circuit board comprised of;

a base layer fabricated of polymeric material having an outermost side and an innermost side;

a conductor layer disposed on said base layer on said outermost side providing a first contact portion and a second contact portion on said second half, and a runner extending from said first contact portion to said second half;

a cover coat layer fabricated of polymeric material disposed on said conductor layer and said base layer on said outermost side of said base layer, and having a first opening for exposing said first contact portion and a second opening for exposing said second contact portion;

a first collector disposed on said base layer on said innermost side on said first half;

a second collector disposed on said base layer on said innermost side on said second half;

wherein said first collector is electrically connected to said runner by a first plated through-hole in said first half, said second collector is electrically connected to said second contact portion by a second plated through-hole in said second half; and wherein said flexible circuit board has a periphery and a fringe portion extending around said periphery, said flexible circuit board is folded over said cell stack such that said first half is adjacent to said first electrode and said second half is adjacent said second electrode, said first collector is in intimate contact with said first electrode, said second collector is in intimate contact with said second electrode, and said fringe portion of said first half is sealed to said fringe portion of said second half.

2. A package as defined by claim 1, wherein said conductor layer further comprises circuit interconnections.

3. A package as defined by claim 2, wherein electrical components are disposed on said package, and interconnected by said circuit interconnections.

4. A package as defined by claim 1, wherein said first contact portion and said second contact portion are disposed on said base layer at an edge of said base layer, thereby providing a card edge connector.

5. A package as defined by claim 4, wherein a stiffener is disposed on said package for supporting said card edge connector.

6. A package as defined by claim 1, wherein said base layer and said cover coat layer are fabricated of materials selected from the group consisting of polyimide, polyester, polyethylene, fluoroplastics, and combinations thereof.

7. A package as defined by claim 1, wherein said conductor layer and said first and second collectors are fabricated of materials selected from the group consisting of copper, tin, aluminum, nickel, gold, silver, conductive polymers, and combinations thereof.

8. A package for a flat electrochemical device, said flat electrochemical device comprising a cell stack having first and second electrodes, said package comprising:

a flexible circuit board having a first half and a second half, said flexible circuit board comprised of;
   a base layer fabricated of polymeric material having an outermost side and an innermost side;
   a conductor layer disposed on said base layer on said outermost side providing first and second contact portions on said second half at an edge of said base layer, a runner extending from said first contact portion to said second half, and circuit interconnections having conductor pads, at least one of said circuit interconnections depending from said runner;
   a cover coat layer fabricated of polymeric material disposed on said conductor layer and said base layer on said outermost side having a first opening for exposing said first contact portion and a second opening for exposing said second contact portion, and openings for exposing said conductor pads;
a first collector disposed on said base layer on said innermost side on said first half;
a second collector disposed on said base layer on said innermost side on said second half;
wherein said first collector is electrically connected to at least one of said circuit interconnections by a first plated through-hole in said first half, said second collector is electrically connected to said second contact portion by a second plated through-hole in said second half;
a stiffener disposed on said edge for supporting said first and second contact portions, thereby providing a card edge connector; and
wherein said flexible circuit board has a periphery and a fringe portion extending around said periphery, said flexible circuit board is folded over said cell stack such that said first half is adjacent to said first electrode and said second half is adjacent said second electrode, said first collector is in intimate contact with said first electrode, said second collector is in intimate contact with said second electrode, and said fringe portion of said first half is sealed to said fringe portion of said second half.

9. A package as defined by claim 8, wherein electrical components are disposed on said package, and interconnected by said circuit interconnections.

10. A package as defined by claim 8, wherein said base layer and said cover coat layer are fabricated of materials selected from the group consisting of polyimide, polyester, polyethylene, fluoroplastics, and combinations thereof.

11. A package as defined by claim 8, wherein said conductor layer and said first and second collectors are fabricated of materials selected from the group consisting of copper, tin, aluminum, nickel, gold, silver, conductive polymers, and combinations thereof.

* * * * *